United States Patent
Hutchinson et al.

(10) Patent No.: US 7,602,448 B2
(45) Date of Patent: Oct. 13, 2009

(54) APPARATUS AND METHOD FOR PROVIDING AN AGC FUNCTION USING MULTIPLE FEEDBACK SOURCES

(75) Inventors: Daniel Mark Hutchinson, Carmel, IN (US); Clint Alan Ecoff, Indianapolis, IN (US); Gary Dean Grubbs, Indianapolis, IN (US); Matthew Thomas Mayer, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 506 days.

(21) Appl. No.: 10/564,345

(22) PCT Filed: Jul. 8, 2004

(86) PCT No.: PCT/US2004/021746
§ 371 (c)(1),
(2), (4) Date: Jan. 11, 2006

(87) PCT Pub. No.: WO2005/009034
PCT Pub. Date: Jan. 27, 2005

(65) Prior Publication Data
US 2006/0187360 A1     Aug. 24, 2006

(51) Int. Cl.
*H04N 5/44* (2006.01)
*H04B 1/06* (2006.01)
*H04B 7/00* (2006.01)

(52) U.S. Cl. ............... 348/725; 348/726; 455/247.1

(58) Field of Classification Search ............... 348/678, 348/733, 731, 725, 705, 706, 558, 735, 737, 348/554, 555, 726; 455/136, 239.1, 240.1, 455/247.1, 251.1
See application file for complete search history.

(56) References Cited

U.S. PATENT DOCUMENTS

| 5,339,454 | A | * | 8/1994 | Kuo et al. | ............... 455/247.1 |
| 6,061,096 | A | | 5/2000 | Limberg | |
| 6,353,463 | B1 | * | 3/2002 | Seo | ............... 348/731 |
| 6,512,554 | B1 | * | 1/2003 | Ogasawara | ............... 348/678 |
| 7,158,192 | B2 | * | 1/2007 | Kunishima | ............... 348/737 |

FOREIGN PATENT DOCUMENTS

EP    0 944 255 A3    9/1999
EP    1 383 318 A3    1/2004

OTHER PUBLICATIONS

Search Report dated Sep. 30, 2004.

* cited by examiner

*Primary Examiner*—M. Lee
(74) *Attorney, Agent, or Firm*—Robert D. Shedd; Joseph J. Opalach; Brian J. Cromarty

(57) ABSTRACT

An apparatus (20) such as a television signal receiver provides an AGC function by using multiple feedback sources which provide both narrow band and wide band AGC signals in an adaptive manner. According to an exemplary embodiment, the apparatus (20) includes a tuner (10, 15, 20, 25, 30) operative to generate first and second IF signals. A first demodulator (40) is operative to generate a first AGC signal responsive to the first IF signal. A second demodulator (50) is operative to generate a second AGC signal responsive to the second IF signal. A wide band AGC detector (60) is operative to generate a third AGC signal responsive to at least one of the first and second IF signals. A switch (70) is operative to selectively provide one of the first, second and third AGC signals to the tuner (10, 15, 20, 25, 30) responsive to a predetermined condition.

16 Claims, 2 Drawing Sheets

Figure 1:
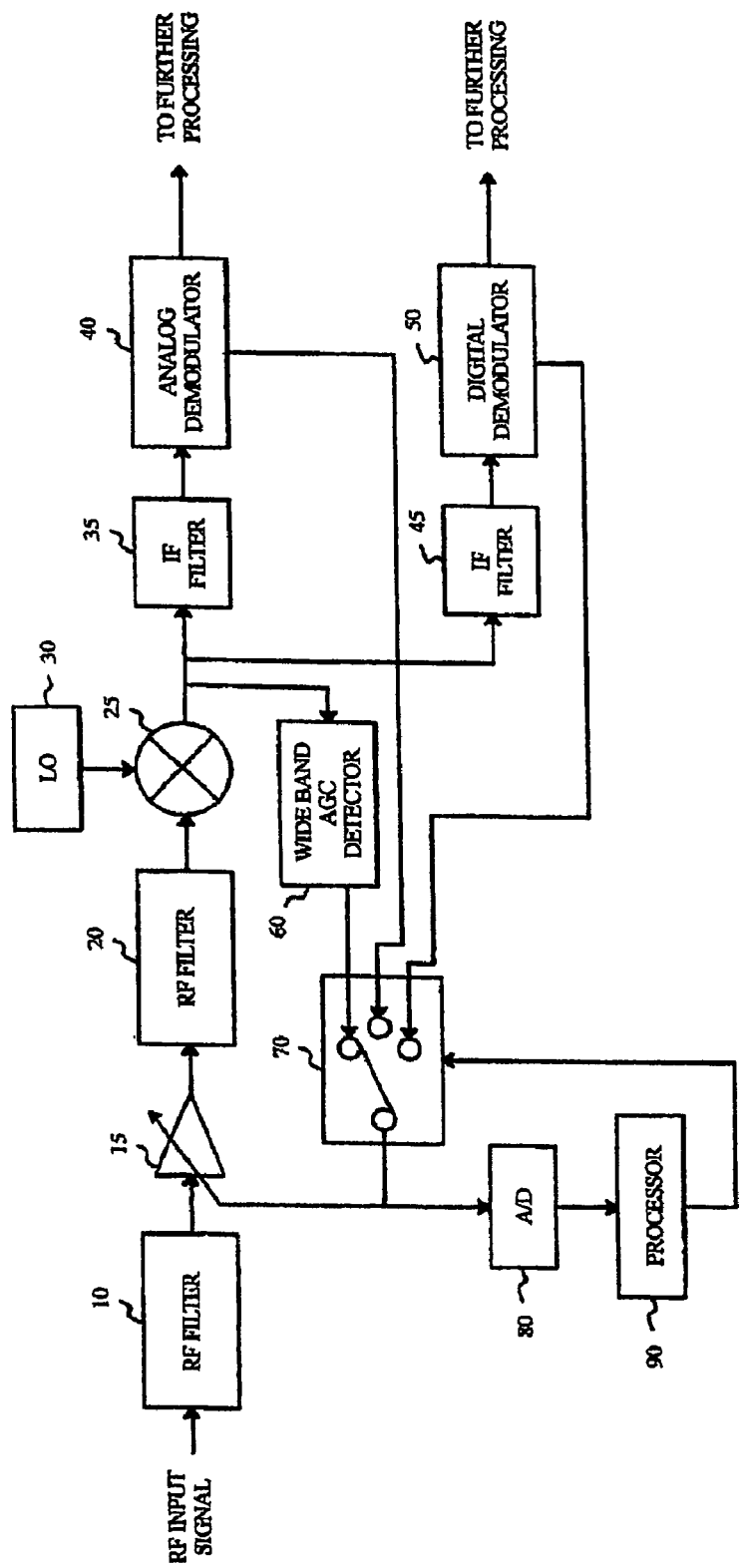

APPARATUS AND METHOD FOR PROVIDING AN AGC FUNCTION USING MULTIPLE FEEDBACK SOURCES

This application claims the benefit, under 35 U.S.C. §365 of International Application PCT/US2004/021746, filed Jul. 8, 2004 which was published in accordance with PCT Article 21(2) on Jan. 27, 2005 in English and which claims the benefit of United States provisional patent application No. 60/487/208 filed Jul. 14, 2003.

The present invention generally relates to automatic gain control (AGC) for apparatuses such as television signal receivers, and more particularly, to an apparatus and method for providing an AGC function which, among other things, uses multiple feedback sources and is capable of providing both narrow band and wide band AGC signals in an adaptive manner.

Apparatuses such as television signal receivers may be capable of receiving and processing both analog signals and digital signals. To accommodate both analog and digital signal processing, such apparatuses may use one tuner and demodulator for analog signals, and another tuner and demodulator for digital signals. Similarly, certain apparatuses may use one tuner and demodulator for cable signals, and another tuner and demodulator for terrestrial signals. In both cases, the use of separate and dedicated tuners and demodulators is generally undesirable in view of manufacturing cost, part count, power consumption, and operational reliability of the entire apparatus circuitry.

Another approach for receiving and processing both analog and digital signals is to use a single tuner with multiple demodulators (e.g., one analog demodulator and one digital demodulator). With this approach, each demodulator may provide a corresponding AGO signal to the tuner in order to enable an AGC function which automatically adjusts the amplitude of a received signal to ensure proper signal processing. In general, an AGC signal may be referred to as a "narrow band" AGC signal if it is generated in response to a signal within, or approximately within, a bandwidth that is equal to, or approximately equal to, the bandwidth of a desired channel. Alternatively, an AGC signal may be referred to as a "wide band" AGC signal if it is generated in response to a signal within a bandwidth that includes a desired channel and one or more adjacent channels.

In general, the use of narrow band AGC signals preserves the signal-to-noise ratio (SNR) of a desired channel in the presence of potentially large undesired signals in adjacent channels, but may allow such large undesired signals to cause non-linear distortion in the desired channel due to amplifier overload in the tuner. Conversely, the use of wide band AGC signals may help preserve the tuner linearity in the face of large undesired signals in adjacent channels, but may cause SNR degradation to the desired channel. Accordingly, there are trade-offs between the use of narrow band and wide band AGC signals. Current apparatuses fail to exploit the potential benefits associated with the aforementioned trade-offs between the use of narrow band and wide band AGC signals, and therefore provide an AGC function in a less than optimal manner. For example, certain apparatuses may use either narrow band AGC signals or wide band AGC signals exclusively.

Accordingly, there is a need for a technique for providing an AGC function for an apparatus such as a television signal receiver which is capable of, among other things, providing both narrow band and wide band AGC signals in an adaptive manner. The present invention addresses these and/or other issues.

In accordance with an aspect of the present invention, signal processing apparatus is disclosed. According to an exemplary embodiment, the signal processing apparatus comprises tuning means for generating first and second IF signals. First AGC means generates a first AGC signal responsive to the first IF signal. Second AGC means generates a second AGC signal responsive to the second IF signal. Third AGC means generates a third AGC signal responsive to at least one of the first and second IF signals. Switching means selectively provides one of the first, second and third AGC signals to the tuning means responsive to a predetermined condition.

In accordance with another aspect of the present invention, a method for providing an AGC function is disclosed. According to an exemplary embodiment, the method comprises steps of using a tuner to generate one of first and second IF signals, generating a first AGC signal responsive to the first IF signal, generating a second AGC signal responsive to the second IF signal, generating a third AGC signal responsive to at least one of the first and second IF signals, and using a switch to selectively provide one of the first, second and third AGC signals to the tuner responsive to a predetermined condition.

In accordance with still another aspect of the present invention, a television signal receiver is disclosed. According to an exemplary embodiment, the television signal receiver comprises a tuner operative to generate first and second IF signals. A first demodulator is operative to generate a first AGC signal responsive to the first IF signal. A second demodulator is operative to generate a second AGC signal responsive to the second IF signal. A wide band AGC detector is operative to generate a third AGC signal responsive to at least one of the first and second IF signals. A switch is operative to selectively provide one of the first, second and third AGC signals to the tuner responsive to a predetermined condition.

Figure 2:
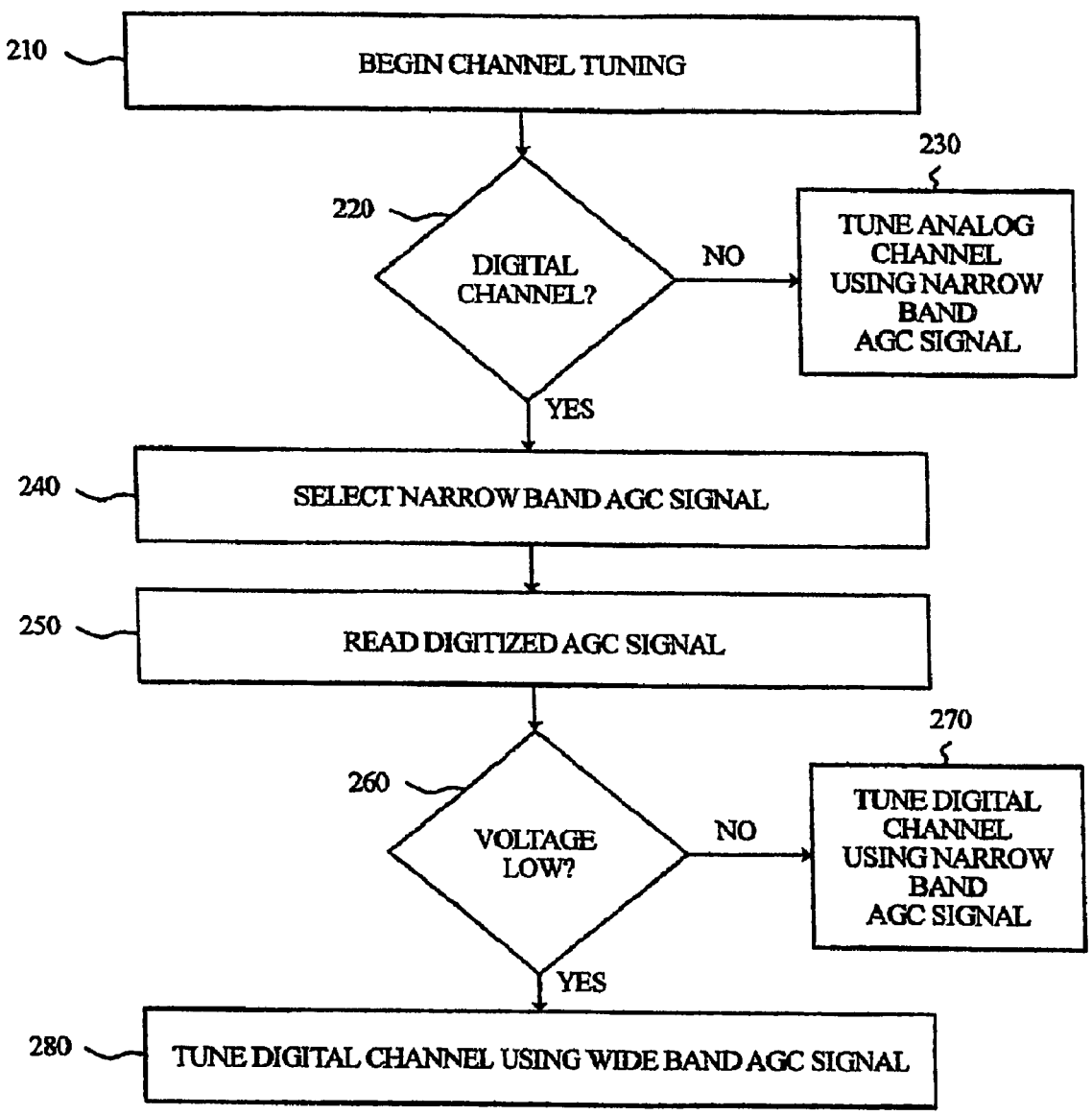

The above-mentioned and other features and advantages of this invention, and the manner of attaining them, will become more apparent and the invention will be better understood by reference to the following description of embodiments of the invention taken in conjunction with the accompanying drawings, wherein:

FIG. 1 is a block diagram of signal processing apparatus according to an exemplary embodiment of the present invention; and FIG. 2 is a flowchart illustrating steps according to an exemplary embodiment of the present invention.

The exemplifications set out herein illustrate preferred embodiments of the invention, and such exemplifications are not to be construed as limiting the scope of the invention in any manner.

Referring now to the drawings, and more particularly to FIG. 1, signal processing apparatus 100 according to an exemplary embodiment of the present invention is shown. Signal processing apparatus 100 may for example represent the front-end processing circuitry of a receiving device such as television signal receiver and/or other device. As shown in FIG. 1, signal processing apparatus 100 comprises first radio frequency (RF) filtering means such as RF filter 10, amplifying means such as automatic gain control (AGC) amplifier 15, second RF filtering means such as RF filter 20, signal mixing means such as signal mixer 25, and oscillating means such as local oscillator (LO) 30. According to an exemplary embodiment, RF filter 10, AGC amplifier 15, RF filter 20, signal mixer 25, and LO 30 represent a signal tuning means of signal processing apparatus 100.

Signal processing apparatus 100 of FIG. 1 further comprises first intermediate frequency (IF) filtering means such as IF filter 35, analog demodulating means such as analog demodulator 40, second IF filtering means such as IF filter 45, digital demodulating means such as digital demodulator 50, wide band AGC detecting means such as wide band AGC detector 60, switching means such as switch 70, analog-to-digital (A/D) converting means such as A/D converter 80, and processing means such as processor 90. The elements of FIG. 1 may be embodied using integrated circuits (ICs), and some elements may for example be included on one or more ICs. For clarity of description, certain conventional elements associated with signal processing apparatus 100 such as certain control signals, power signals and/or other elements may not be shown in FIG. 1.

RF filter 10 is operative to filter an RF input signal responsive to user channel selection to thereby generate a first filtered RF signal. According to an exemplary embodiment, the RF input signal received by RF filter 10 may include audio, video and/or data content and be provided from one or more signal sources such as terrestrial, cable, satellite, internet and/or other signal sources.

AGC amplifier 15 is operative to amplify the first filtered RF signal provided from RF filter 10 responsive to an AGC signal provided from switch 70 to thereby generate a gain controlled RF signal. As will be described later herein, the AGC signal provided to AGC amplifier 15 may originate from a plurality of different feedback sources and be either a narrow band AGC signal or a wide band AGC signal.

RF filter 20 is operative to filter the gain controlled RF signal provided from AGC amplifier 15 responsive to user channel selection to thereby generate a second filtered RF signal. In general, the filtering operations of RF filters 10 and 20 isolate signals responsive to user channel selection and prevent undesired signals from interfering with a desired signal within the selected channel.

Signal mixer 25 is operative to mix the second filtered RF signal provided from RF filter 20 with a LO signal to thereby generate a first IF signal and/or a second IF signal. According to an exemplary embodiment, signal mixer 25 generates a first IF signal representing an analog channel (e.g., NTSC, PAL, SECAM, etc.) if the user has selected an analog channel, and generates a second IF signal representing a digital channel (e.g., ATSC, QAM, etc.) if the user has selected a digital channel. LO 30 is operative to generate the LO signal responsive to user channel selection.

IF filter 35 is operative to filter the first IF signal provided from signal mixer 25 to thereby generate a first filtered IF signal. According to an exemplary embodiment, IF filter 35 filters the first IF signal responsive to user channel selection so as to pass only a selected analog channel. IF filter 35 may for example be embodied using one or more surface acoustical wave (SAW) filters.

Analog demodulator 40 is operative to demodulate the first filtered IF signal provided from IF filter 35 to thereby generate a demodulated analog signal. According to an exemplary embodiment, analog demodulator 40 is operative to demodulate one or more types of analog modulated signals (e.g., NTSC, PAL, SECAM, etc.). As indicated in FIG. 1, the demodulated analog signal output from analog demodulator 40 may be provided for further processing (e.g., decoding, etc.). Also according to an exemplary embodiment, analog demodulator 40 provides a first AGC signal to switch 70 responsive to the first filtered IF signal. According to an exemplary embodiment, the first AGC signal is a narrow band signal in that it is generated in response to a signal within, or approximately within, a bandwidth that is equal to, or approximately equal to, the bandwidth of a desired analog channel being received. The actual bandwidth used for the first AGC signal may be a matter of design choice. The first AGC signal facilitates the particular RF AGC delay point and AGC voltage required by AGC amplifier 15. Analog demodulator 40 may for example be embodied as a synchronous phase locked loop (PLL) type demodulator.

IF filter 45 is operative to filter the second IF signal provided from signal mixer 25 to thereby generate a second filtered IF signal. According to an exemplary embodiment, IF filter 35 filters the second IF signal responsive to user channel selection so as to pass only a selected digital channel. IF filter 45 may for example be embodied using one or more surface acoustical wave (SAW) filters.

Digital demodulator 50 is operative to demodulate the second filtered IF signal provided from IF filter 45 to thereby generate a demodulated digital signal. According to an exemplary embodiment, digital demodulator 50 is operative to demodulate one or more types of digitally modulated signals (e.g., ATSC, QAM, etc.). As indicated in FIG. 1, the demodulated digital signal output from digital demodulator 50 may be provided for further processing (e.g., decoding, etc.). Also according to an exemplary embodiment, digital demodulator 50 provides a second AGC signal to switch 70 responsive to the second filtered IF signal. According to an exemplary embodiment, the second AGC signal is also a narrow band signal in that it is generated in response to a signal within, or approximately within, a bandwidth that is equal to, or approximately equal to, the bandwidth of a desired digital channel being received. The actual bandwidth used for the second AGC signal may be a matter of design choice. The second AGC signal facilitates the particular RF AGC delay point and AGC voltage required by AGC amplifier 15. Digital demodulator 50 may for example be embodied using an IC such as a BCM3510 model IC manufactured by Broadcom, or an NXT2003 model IC manufactured by ATI.

Wide band AGC detector 60 is operative to generate a third AGC signal 5 responsive to the first and/or second IF signals provided from signal mixer 25. According to an exemplary embodiment, the third AGC signal is a wide band AGC signal in that it is generated in response to a signal within a bandwidth that includes a desired channel and one or more adjacent channels. The actual bandwidth used for the third AGC signal may be a matter of design choice. Wide band AGC detector 60 may for example be embodied using an IC such as a TUA6030/34 model IC manufactured by Infineon.

Switch 70 is operative to selectively provide one of the first, second and third AGC signals from analog demodulator 40, digital demodulator 50 and wide band AGC detector 60, respectively, to AGC amplifier 15 and A/D converter 80 responsive to a control signal from processor 90. In this manner, switch 70 selectively provides AGC signals from multiple feedback sources of signal processing apparatus 100, and can provide both narrow band and wide band AGC signals in an adaptive manner.

A/D converter 80 is operative to convert signals from an analog format to a digital format. According to an exemplary embodiment, A/D converter 80 converts the AGC signal output from switch 70 from an analog format to a digital format.

Processor 90 is operative to perform various processing, control and memory functions of signal processing apparatus 100. According to an exemplary embodiment, processor 90 receives and processes the digitized AGC signal provided from A/D converter 80 and generates a control signal that controls switch 70 responsive to the digitized AGC signal. Processor 90 is also operative to perform other functions associated with signal processing apparatus 100 such as, but not limited to, detecting and processing user inputs such as channel selection inputs, providing control signals to enable channel tuning, detecting channel types (i.e., analog versus digital), memory, and other functions.

To facilitate a better understanding of the present invention, an example will now be provided. Referring to FIG. 2, a flowchart 200 illustrating steps according to an exemplary embodiment of the present invention is shown. For purposes of example and explanation, the steps of FIG. 2 will be described with reference to signal processing apparatus 100 of FIG. 1. The steps of FIG. 2 are merely exemplary, and are not intended to limit the present invention in any manner.

At step 210, signal processing apparatus 100 begins a channel tuning process. According to an exemplary embodiment, the channel tuning process begins at step 210 in response to a user channel selection input to signal processing apparatus 100 via a user input device (not shown in FIG. 1) such as a hand-held remote control device, integrated key panel, wired and/or wireless keyboard, and/or other input device. The user channel selection input causes RF filters 10 and 20 to filter the RF input signal while LO 30 provides an LO signal corresponding to the selected channel to signal mixer 25, thereby beginning the channel tuning process at step 210.

At step 220, a determination is made as to whether the selected channel being tuned is a digital channel. According to an exemplary embodiment, processor 90 is programmed to make the determination at step 220 responsive to a control signal (not shown in FIG. 1) provided from digital demodulator 50 which indicates whether digital demodulator 50 is able to obtain a demodulation lock on a valid digital channel signal. Other ways of determining whether the selected channel is a digital channel may also be used at step 220 according to the present invention. In this manner, processor 90 is able to determine whether the selected channel is an analog channel (e.g., NTSC, PAL, SECAM, etc.) or a digital channel (e.g., ATSC, QAM, etc.) at step 220.

If the determination at step 220 is negative, process flow advances to step 230 where signal processing apparatus 100 tunes the analog channel using the narrow band AGC signal provided from analog demodulator 40. According to an exemplary embodiment, processor 90 outputs a control signal which causes switch 70 to pass the first AGC signal from analog demodulator 40 to AGC amplifier 15 and A/D converter 80. As previously indicated herein, the first AGC signal provided from analog demodulator 40 is a narrow band AGC signal in that it is generated in response to a signal within, or approximately within, a bandwidth that is equal to, or approximately equal to, the bandwidth of the desired analog channel being tuned. For example, if the analog channel being tuned has a 6 MHz bandwidth, the first AGC signal may be generated in response to a signal having a bandwidth that is equal to, or approximately equal to, 6 MHz. According to an exemplary embodiment, the use of a narrow band AGC signal is preferred when tuning an analog channel.

If the determination at step 220 is positive, process flow advances to step 240 where signal processing apparatus 100 selects the narrow band AGC signal provided from digital demodulator 50. According to an exemplary embodiment, processor 90 outputs a control signal which causes switch 70 to pass the second AGC signal from digital demodulator 50 to AGC amplifier 15 and A/D converter 80. As previously indicated herein, the second AGC signal provided from digital demodulator 50 is a narrow band AGC signal in that it is generated in response to a signal within, or approximately within, a bandwidth that is equal to, or approximately equal to, the bandwidth of the desired digital channel being tuned. For example, if the digital channel being tuned has a 6 MHz bandwidth, the second AGC signal may be generated in response to a signal having a bandwidth that is equal to, or approximately equal to, 6 MHz.

At step 250, the digitized AGC signal is read by processor 90. According to an exemplary embodiment, processor 90 reads the digitized AGC signal provided from AGC converter 80 which is a digital representation of the second AGC signal generated by digital demodulator 50.

At step 260, a determination is made as to whether the digitized AGC signal exhibits a low voltage (i.e., binary low state). According to an exemplary embodiment, the digitized AGC signal exhibits a low voltage when the tuning means of signal processing apparatus 100 is in a gain reduction mode, thereby indicating that the SNR of the digital channel being tuned is relatively high. Conversely, the digitized AGC signal exhibits a high voltage (i.e., binary high state) at step 260 when the gain of the tuning means of signal processing apparatus 100 is still increasing, thereby indicating that digital demodulator 50 may still be attempting to obtain a demodulation lock. The actual voltage level that constitutes a low voltage and/or a high voltage at step 260 may be matter of design choice.

If the determination at step 260 is negative, process flow advances to step 270 where signal processing apparatus 100 tunes the digital channel using the narrow band AGC signal provided from digital demodulator 50. According to an exemplary embodiment, processor 90 continues to cause switch 70 to pass the second AGC signal from digital demodulator 50 to AGC amplifier 15 and A/D converter 80 at step 270. Accordingly, a narrow band AGC signal is used for digital channel tuning when the digitized AGC signal exhibits a high voltage at step 260.

If the determination at step 260 is positive, process flow advances to step 280 where signal processing apparatus 100 tunes the digital channel using the wide band AGC signal provided from wide band AGC detector 60. According to an exemplary embodiment, processor 90 outputs a control signal which causes switch 70 to pass the third AGC signal from wide band AGC detector 60 to AGC amplifier 15 and A/D converter 80. As previously indicated herein, the third AGC signal provided from wide band AGC detector 60 is a wide band AGC signal in that it is generated in response to a signal within a bandwidth that includes a desired channel and one or more adjacent channels. For example, if the digital channel being tuned has a 6 MHz bandwidth, the third AGC signal may be generated in response to a signal having a bandwidth that is equal to, or approximately equal to, 18 MHz (i.e., desired channel plus two adjacent channels). Accordingly, a wide band AGC signal is used for digital channel tuning when the digitized AGC signal exhibits a low voltage at step 260.

Variations of the steps of FIG. 2 are also within the scope of the present invention. For example, processor 90 may detect any type of predetermined condition(s) in determining whether to use a narrow wide AGC signal or a wide band AGC signal for channel tuning, and the specific predetermined condition(s) used is a matter of design choice. One variation may include first using a narrow band AGC signal and detecting the resultant SNR or packet error rate. Next, a wide band AGC signal is used, and the resultant SNR or packet error rate is likewise detected. The narrow band or wide band AGC signal may then be selected based on which one provides the best SNR or packet error rate. Another variation may include examining a channel scan list over a range of channels likely to cause distortion problems (e.g., N±1, N±2, etc.). If there are no channels in the list that can cause distortion problems, then a narrow band AGC signal may be used. If interfering channels are present, a narrow band AGC signal may first be used and the RF (and IF) AGC values may be recorded to estimate the desired channel's input power level. If the estimated input power level of the desired channel is above a predetermined threshold (to avoid SNR problems), then a wide band AGC signal may be used. If the estimated input power level of the desired channel is not above the predetermined threshold, then the narrow band AGC signal may continue to be used. Other variations may also be used according to the present invention.

As described herein, the present invention provides an apparatus and method for providing an AGC function which, among other things, uses multiple feedback sources and is capable of providing both narrow band and wide band AGC signals in an adaptive manner. The present invention may be applicable to various apparatuses, either with or without a display device. Accordingly, the phrases "signal processing apparatus" and "television signal receiver" as used herein may refer to systems or apparatuses including, but not limited to, television sets, computers or monitors that include a display device, and systems or apparatuses such as set-top boxes, video cassette recorders (VCRs), digital versatile disk (DVD) players, video game boxes, personal video recorders (PVRs), radio/audio devices, computers or other apparatuses that may not include a display device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. Signal processing apparatus comprising:
   tuning means for generating first and second IF signals;
   first AGC means for generating a first AGC signal responsive to said first IF signal within a first bandwidth;
   second AGC means for generating a second AGC signal responsive to said second IF signal within a second bandwidth;
   third AGC means for generating a third AGC signal responsive to at least one of said first and second IF signals within a third bandwidth wherein said third bandwidth is greater than each of said first bandwidth and said second bandwidth; and
   switching means for selectively providing one of said first, second and third AGC signals to said tuning means responsive to a predetermined condition.

2. The signal processing apparatus of claim 1, wherein:
   said first IF signal represents an analog channel; and
   said first AGC means comprises an analog demodulator.

3. The signal processing apparatus of claim 1, wherein:
   said second IF signal represents a digital channel; and
   said second means comprises a digital demodulator.

4. The signal processing apparatus of claim 1, wherein said third AGC means comprises a wide band AGC detector.

5. The signal processing apparatus of claim 1, further comprising processing means for outputting a control signal that causes said switching means to provide one of said first, second and third AGC signals.

6. The signal processing apparatus of claim 1, wherein: said first and second AGC signals are narrow band signals.

7. A method for providing an AGC function, comprising:
   using a tuner to generate one of first and second IF signals;
   generating a first AGC signal responsive to said first IF signal within a first bandwidth;
   generating a second AGC signal responsive to said second IF signal within a second bandwidth;
   generating a third AGC signal responsive to at least one of said first and second IF signals within a third bandwidth wherein said third bandwidth is greater than each of said first bandwidth and said second bandwidth; and
   using a switch to selectively provide one of said first, second and third AGC signals to said tuner responsive to a predetermined condition.

8. The method of claim 7, wherein said first IF signal represents an analog channel.

9. The method of claim 7, wherein said second IF signal represents a digital channel.

10. The method of claim 7, further comprised of generating a control signal that causes said switch to provide one of said first, second and third AGC signals.

11. The method of claim 7, wherein:
    said first and second AGC signals are narrow band signals; and
    said third AGC signal is a wide band signal.

12. A television signal receiver, comprising:
    a tuner operative to generate first and second IF signals;
    a first demodulator operative to generate a first AGC signal responsive to said first IF signal within a first bandwidth;
    a second demodulator operative to generate a second AGC signal responsive to said second IF signal within a second bandwidth;
    a wide band AGC detector operative to generate a third AGC signal responsive to at least one of said first and second IF signals within a third bandwidth wherein said third bandwidth is greater than each of said first bandwidth and said second bandwidth; and
    a switch operative to selectively provide one of said first, second and third AGC signals to said tuner responsive to a predetermined condition.

13. The television signal receiver of claim 12, wherein:
    said first IF signal represents an analog channel; and
    said first demodulator comprises an analog demodulator.

14. The television signal receiver of claim 12, wherein:
    said second IF signal represents a digital channel; and
    said second demodulator comprises a digital demodulator.

15. The television signal receiver of claim 12, further comprising a processor operative to output a control signal that causes said switch to provide one of said first, second and third AGC signals.

16. The television signal receiver of claim 12, wherein:
    said first and second AGC signals are narrow band signals; and said third AGC signal is a wide band signal.

* * * * *

UNITED STATES PATENT AND TRADEMARK OFFICE
CERTIFICATE OF CORRECTION

PATENT NO. : 7,602,448 B2  Page 1 of 1
APPLICATION NO. : 10/564345
DATED : October 13, 2009
INVENTOR(S) : Hutchinson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this

Fifth Day of October, 2010

David J. Kappos
*Director of the United States Patent and Trademark Office*